(12) United States Patent
Shi et al.

(10) Patent No.: US 6,383,640 B1
(45) Date of Patent: May 7, 2002

(54) CONDUCTING POLYMER FOR HIGH POWER ULTRACAPACITOR

(75) Inventors: Steven Z. Shi, Latham, NY (US); Shimshon Gottesfeld, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/653,615

(22) Filed: Aug. 31, 2000

Related U.S. Application Data

(60) Provisional application No. 60/186,721, filed on Mar. 3, 2000.

(51) Int. Cl.[7] .................................................. B32B 9/00
(52) U.S. Cl. ...................... 428/408; 429/209; 429/212; 429/213
(58) Field of Search .................. 428/408; 429/213, 429/209, 212

(56) References Cited

U.S. PATENT DOCUMENTS

| | | | |
|---|---|---|---|
| 4,488,203 A | 12/1984 | Muranaka et al. | 361/433 |
| 4,986,886 A | 1/1991 | Wei et al. | 204/78 |
| 5,527,640 A | 6/1996 | Rudge et al. | 429/213 |
| 5,591,318 A | 1/1997 | Li et al. | 205/210 |
| 5,637,421 A | 6/1997 | Poehler et al. | 429/190 |
| 5,714,053 A | 2/1998 | Howard | 205/220 |
| 5,751,541 A | 5/1998 | Li et al. | 361/525 |
| 5,811,205 A | 9/1998 | Andrieu | 429/137 |

*Primary Examiner*—Deborah Jones
*Assistant Examiner*—Abraham Bahta
(74) *Attorney, Agent, or Firm*—Ray G. Wilson

(57) ABSTRACT

In accordance with the purposes of the present invention, as embodied and broadly described herein, the present invention is directed to an electrode having a conducting polymer active material for use in an ultracapacitor. The conducting polymer active material is electropolymerized onto a carbon paper substrate from a mixed solution of a dimer of (3,3' bithiophene) (BT) and a monomer that is selected from the group of thiophenes derived in the 3-position, having an aryl group attached to thiophene in the 3-position or having aryl and alkly groups independently attached to thiophene in the 3 and 4 positions.

6 Claims, 11 Drawing Sheets

3-(4-fluorophenyl)thiophene (FPT)

poly(3-(4-fluorophenyl)thiophene (PFPT)

3,3'-bithiophene poly(3,3'-bithiophene)

3-(4-fluorophenyl))thiophene (FPT)

poly(3-(4-fluorophenyl)thiophene (PFPT)

3,3'-bithiophene poly(3,3'-bithiophene)

CONDUCTING POLYMER FOR HIGH POWER ULTRACAPACITOR

RELATED APPLICATIONS

This application claims the benefit of provisional application No. 60/186,721 filed Mar. 3, 2000.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to ultracapacitors, and, more particularly to ultracapacitors having conducting polymers as the active material.

BACKGROUND OF THE INVENTION

Electrochemical capacitors, also called supercapacitors or ultracapacitors, are energy storage devices which can store more energy than traditional capacitors and discharge this energy at higher rates than rechargeable batteries. In addition, the cycle life of electrochemical capacitors should far exceed that of a battery system. Ultracapacitors are attractive for potential applications in emerging technology areas that require electric power in the form of pulses. Examples of such applications include digital communication devices that require power pulses in the millisecond range, and traction power systems in an electric vehicle where the high power demand can last from seconds up to minutes. Battery performance and cycle life deteriorate severely with increasing power demand. A capacitor-battery combination has been proposed where the capacitor handles the peak power and the battery provides the sustained load between pulses. Such a hybrid power system can apparently improve the overall power performance and extend battery cycle life without increase in size or weight of the system.

An ultracapacitor is basically the same as a battery in terms of general design, the difference being that the nature of charge storage in the electrode active material is capacitive; i.e., the charge and discharge processes involve only the movement of electronic charge through the solid electronic phase and ionic movement through the solution phase.

Energy storage densities of ultracapacitors are much higher than those of conventional capacitors, but typically lower than those of advanced batteries. However, compared to batteries, higher power densities and longer cycle life have been either demonstrated or projected. These latter advantages of ultracapacitors over batteries are achievable because no rate-determining and life-limiting phase transformations take place at the electrode/electrolyte interface.

The dominant ultracapacitor technology has been based on double-layer type charging at high surface area carbon electrodes, where a capacitor is formed at the carbon/electrolyte interface by electronic charging of the carbon surface with counter-ions in the solution phase migrating to the carbon surface in order to counterbalance that charge. Conducting polymers also have been investigated for use in ultracapacitors. Higher energy densities can be achieved because charging occurs through the volume of the active polymer material rather than just at the outer surface. When a conducting polymer is being p-doped (positively charged), electrons leave the polymer backbone to generate an excess positive charge; anions migrate from the electrolyte solution into the polymer matrixes to counter the positive charge. In the case of n-doping of conducting polymers, the polymer backbone becomes negatively charged by the addition of electrons from the external circuit; cations enter the polymer matrixes from the electrolyte solution to balance the negative charge.

Another technology currently being pursued for the active material in ultracapacitors is based on noble metal oxides, predominantly ruthenium oxide. Charging in such active material has been reported to take place through the volume of the material and, as a result, the charge and energy densities observed are comparable with, or even slightly higher than, those obtained for conducting polymers. However, conducting polymers can generally be fabricated at significantly lower cost than noble metal oxides, with costs comparable to those of activated carbons. It is the combination of high energy density and low material cost that makes conducting polymers attractive active materials for ultracapacitors.

As disclosed in the U.S. Pat. No. 5,527,640 and described elsewhere, at least three different types of ultracapacitors can be constructed, using conducting polymer as electrode active material. A Type I capacitor is based on a symmetric configuration, with the same p-dopable conducting polymer active material on both electrodes of a cell. A Type II capacitor has an asymmetric configuration, with two different p-dopable active materials on the two electrodes. Relatively simple conducting polymers, such as polyaniline, polypyrrole and polythiophene, can be efficiently p-doped and can easily be synthesized from inexpensive commercially available monomers. However, the voltage window of a single cell device is limited in the range of 1 V to 1.5 V.

The most promising type is the Type III ultracapacitor that has a conducting polymer that can be charged both positively (p-doped) and negatively (n-doped). When a Type III capacitor is fully charged, one electrode is in a fully p-doped state and the other is in a fully n-doped state. When the capacitor is discharged, both electrodes will return to their undoped state. As a result, the cell voltage is increased to about 3 V and the full doping charge is released on discharge.

In addition to the increased energy density (since $E=\frac{1}{2}CV^2$, where E is the stored energy, C is the capacitance of the device, and V is the voltage across the device), the Type III capacitor has two further advantages over Types I and II. Firstly, when a Type III capacitor is charged, both polymer electrodes are in a doped, highly conducting state and, therefore, the instantaneous power density at discharge is greater. In contrast, in a charged capacitor of Type I or II, one of the polymer electrode is in the undoped, semi-insulating state, resulting in a high impedance, which diminishes the instantaneous power density at discharge. Secondly, all the stored charge in a Type III capacitor is released at relatively high voltages. This is advantageous because charge delivered at a voltage that is too low may not be useful. Thus, the Type III configuration provides the best opportunity for an ultracapacitor based on conducting polymers to deliver the highest energy and power densities.

Previous studies have shown that poly(3-(phenyl)thiophene) derivatives substituted in the para-position, such as poly(3-(4-fluorophenyl)thiophene) (PFPT), are potentially active materials for the Type III ultracapacitor.

Various objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the purposes of the present invention, as embodied and broadly described herein, the present invention is directed to a conducting polymer active material for use in an ultracapacitor. The conducting polymer active material is electropolymerized onto a carbon paper substrate from a mixed solution of a dimer of (3,3' bithiophene) (BT) and a monomer that is selected from the group of thiophenes derived in the 3-position, having an aryl group attached to thiophene in the 3-position, or having aryl and alkly groups independently attached to thiophene in the 3 and 4 positions.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION

In spite of demonstrated high energy and power densities for PFPT active materials, a significant shortcoming of ultracapacitors based on PFPT was limited cycle life-a major challenge with conducting polymers, as well as other active materials operating across a wide voltage window. In the present invention, a modified conducting polymer active material is described with significantly improved cycle life. The new active material possesses ultra-high surface area and extended cycle life. The new polymer material can be directly deposited onto a carbon paper electrode substrate by electropolymerization from a mixed solution of 3-(4-fluorophenyl) thiophene (FPT) monomer and 3,3'-bithiophene (BT) dimer. FIGS. 1A, 1B, 1C, and 1D show the structures of 3-(4-fluorophenyl) thiophene, 3,3'-bithiophene and the corresponding polymer chains.

In one example of the present invention, the new conducting polymer active material is electropolymerized galvanostatically onto a carbon paper electrode substrate at 6 mA cm$^{31\ 2}$ to a total growth charge in the range from 5 to 20 C cm$^{-2}$, from a mixed solution of 0.1 M FPT monomer and BT dimer in acetonitrile, with 1 M Et$_4$NPF$_6$ supporting electrolyte. The mass ratio of FPT monomer to BT dimer in solution may be varied depending on the electropolymerization conditions. An examplary composition is 90% by weight of FPT monomer and 10% by weight of BT dimer. The new conducting polymer active material, fabricated from the mixture of FPT monomer and BT dimer, is significantly superior to that fabricated from FPT monomer alone in terms of polymer morphology and material stability.

Figure 1A:
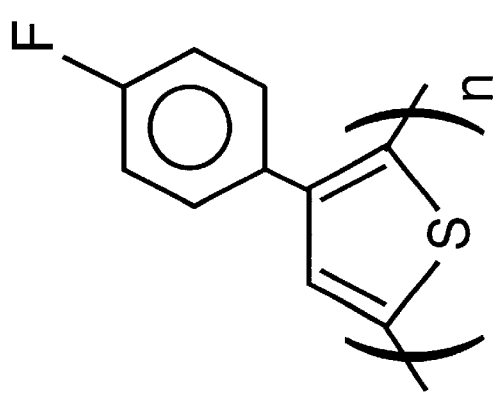
FIG. 1A and 1B show the structure of 3-(4-fluorophenyl) thiophene (FPT) monomer and the corresponding polymer.
Figure 1B:
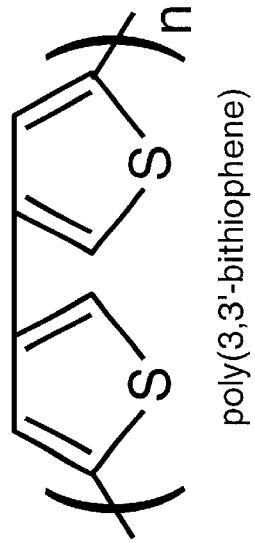
Figure 1C:
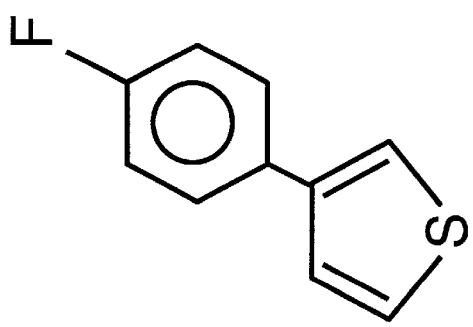
FIGS. 1C and 1D show the structure of a 3,3'-bithiphene (BT) dimer and the corresponding polymer.
Figure 1D:
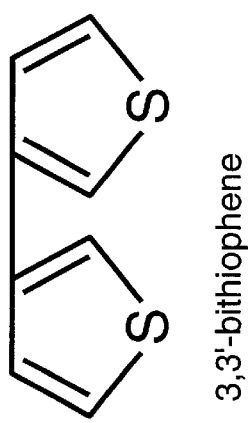
Figure 2:
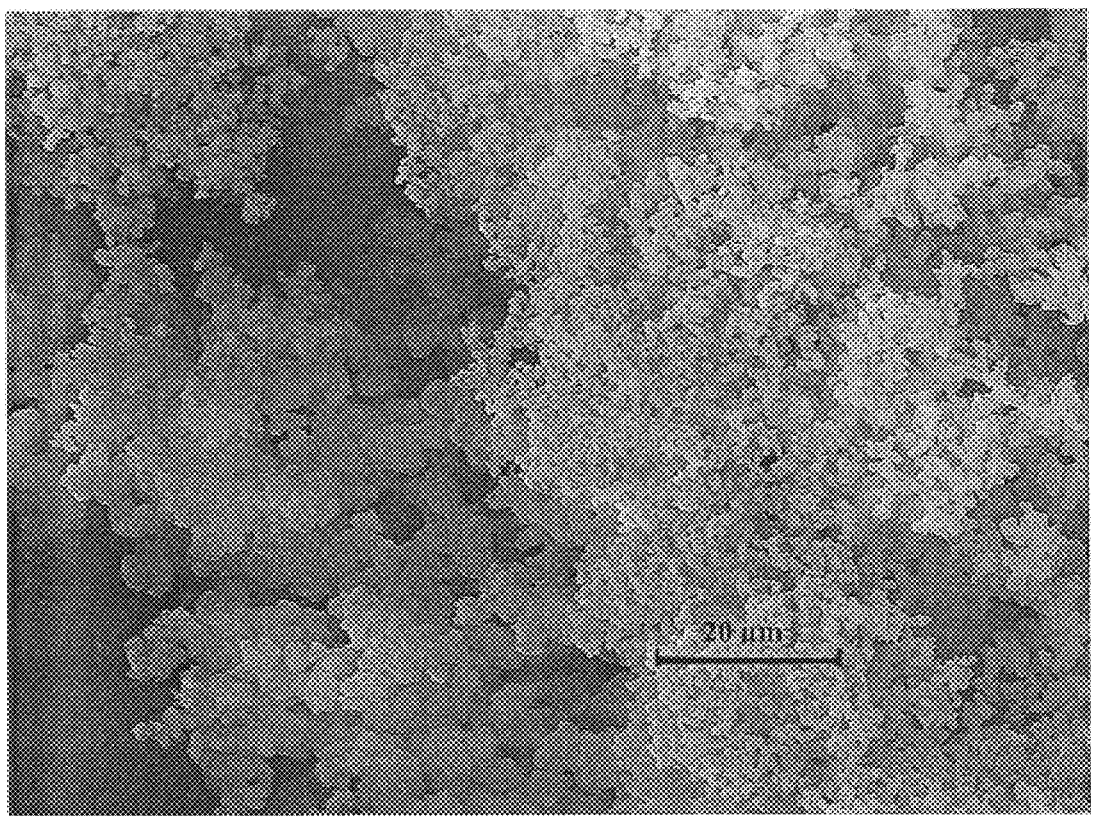
FIG. 2 is an SEM micrograph showing the morphology the conducting polymer deposited on a carbon paper substrate from a mixed solution of FPT monomer and BT dimer.

FIG. 2 is an exemplary SEM micrograph showing a unique morphology of conducting polymer deposited on a carbon paper substrate from a mixed solution of FPT monomer and BT dimer. The new polymer morphology exhibits a highly porous, open structure, with polymer grain size in the sub-micron range or even down to nanometer scale. This morphology provides a large, effective, electrolyte accessible polymer surface area, leading to fast charge/discharge dynamics.

Figure 3:
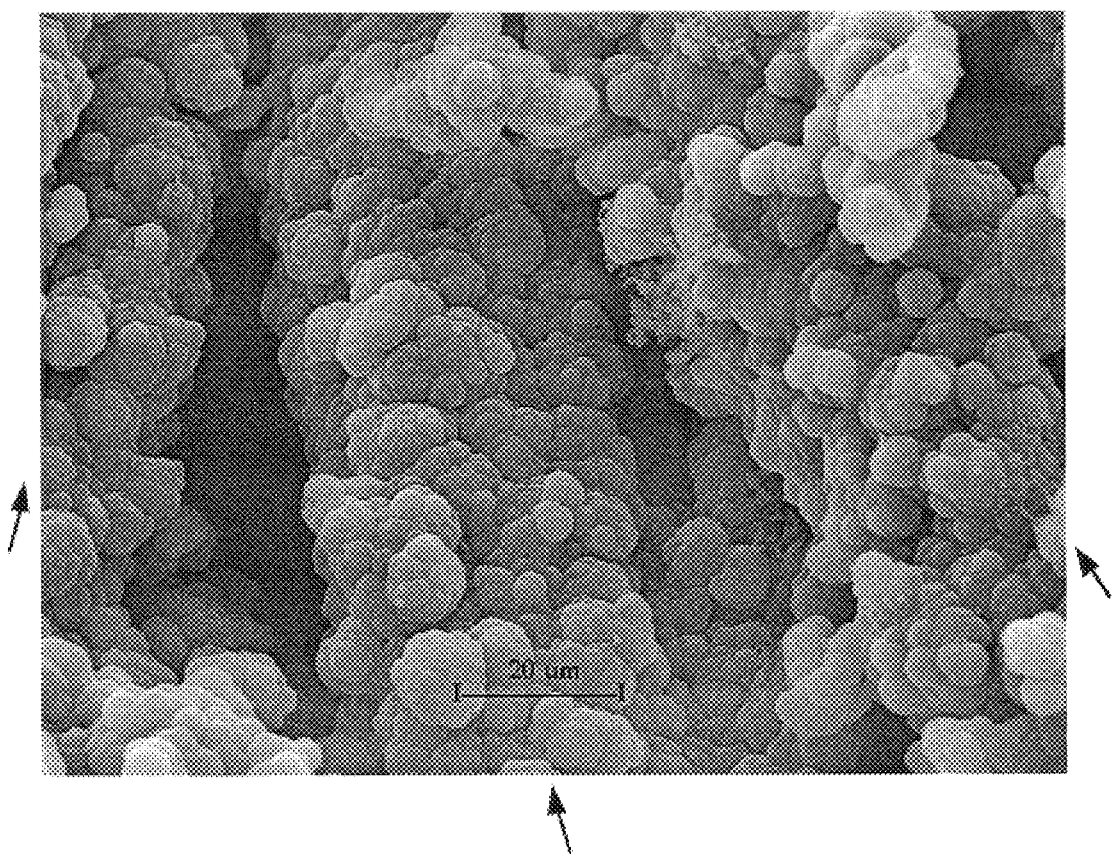
FIG. 3 is an SEM micrograph showing the morphology of a conducting polymer deposited on a carbon paper substrate from a solution of FPT monomer alone.

In comparison, the morphology of conducting polymer fabricated from FPT monomer alone, referring to FIG. 3, shows a more compact structure, with polymer grain size in the range of several microns. The cycle life in pulsed discharge mode of an ultracapacitor with polymer prepared from FPT monomer alone, is limited to 105 cycles. It has been extended over 2.7×10$^6$ cycles with the polymer prepared from a mixed solution of FPT monomer and BT dimer.

Figure 4:
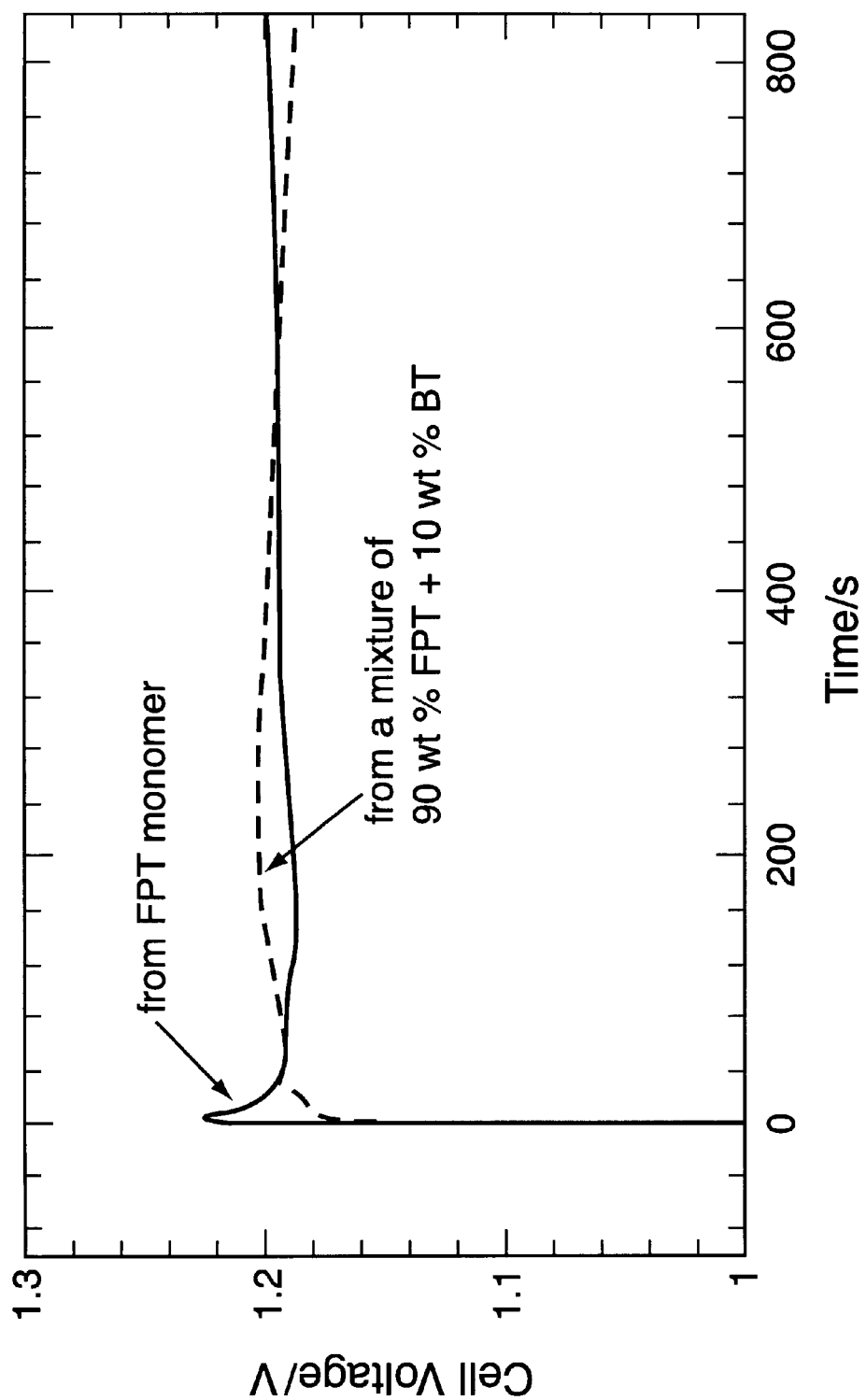
FIG. 4 graphically depicts voltage-time curves for electropolymerization at constant current from FPT monomer alone and from a mixture of FPT and BT.

As indicated by the electropolymerization curves, shown in FIG. 4, constant current electropolymerization from an electrolyte solution containing FPT monomer alone exhibits a relatively large initial overpotential peak, suggesting a higher nucleation energy. In contrast, electropolymerization from a mixed FPT monomer and BT dimer solution shows little, if any, initial overpotential peak and, therefore, smaller nucleation energy. This smaller nucleation energy apparently allows the rapid creation of a larger number of nucleation sites, enabling electrodeposited polymers to form with much smaller grain size, and to improve adhesion of the active polymer to the carbon fibers. As a beneficial additive to the electropolymerization solution, bithiophene may also result in polymer cross-linking, and, hence, stability.

The foregoing discovery of a new active material is not limited to polymer (copolymer) electropolymerized from a solution mixed of FPT monomer and BT dimer. New conducting polymers with even better morphology and stability may be electropolymerized from a solution of other mixed monomers. Exemplary replacements for FPT include phenyl, substituted phenyl or other aryl group attached to thiophene in the 3-position or/and 4-position.

The present invention may be better understood from the examples that follow.

EXAMPLES

Figure 5:
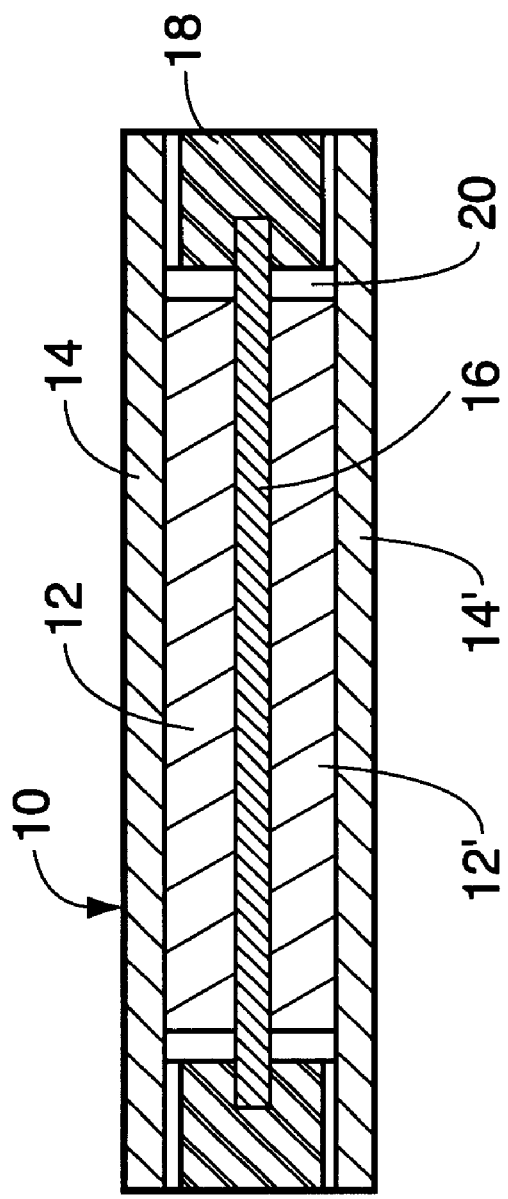
FIG. 5 is a cross-section of an ultracapacitor constructed with an active material according to the present invention.

In order to further illustrate the features of the present invention, a button (or coin) type single-cell ultracapacitor 10 illustrated in FIG. 5 was constructed with the conducting polymer active material deposited from a mixed FPT monomer and BT dimer solution. The exemplary device comprised a pair of symmetric, conducting polymer coated carbon paper disk electrodes 12, 12', supported on conductive film (Rexam) current collector plates 14, 14', an insulating separator 16 sandwiched between electrodes 12, 12', a gasket 18 heat-sealed around the periphery of separator 16 and between current collectors 14, 14', and an impregnated electrolyte solution 20.

The carbon paper disk electrodes 12, 12', 1.59 cm in diameter, were prepared from 400 pm thick Spectracarb 2050A (about 8 pm diameter interconnected fibers, 80% porosity, 0.25 g/cc, Spectracorp, MA). The current collector plates 14, 14' of diameter of 2.54 cm, were prepared from 100 pm thick Rexam COER conductive film (Rexam Graphics, MA). Separator 16, with a diameter of 1.69 cm, was prepared from 25 pm thick Solupor membrane (DSM 7P03, or DSM 7P20, DSM Solutech, The Netherlands). Heat-sealable gasket 18, having an inner diameter of 1.75 cm and an outer diameter of 2.54 cm, was prepared from a polyolefin film. Electrolyte 20 was 2 M $Et_4NBF_4$ in acetonitrile.

Carbon paper disc electrodes 12, 12' were bonded to current collector plates 14, 14' by applying graphite-filled epoxy (51% by weight of graphite, 41% epoxy resin and 8% epoxy hardener). After bonding, the electrode assembly was dried for about 12 hours in vacuum and then introduced into a polymerization cell. The conducting polymer active material was electropolymerized galvanostatically onto the carbon paper electrode substrate at 6 mA cm$^{-2}$ to a total growth charge of 5 C cm$^{-2}$ from a mixed solution of FPT monomer and BT dimer dissolved in acetonitrile, with 1 M $Et_4NPF_6$ supporting electrolyte. Suitable electrolytes include tetraethylammonium salts of trifluoromethane sulfonate, tetrafluoroborate, and hexafluorophosphate. The FPT monomer and BT dimer made a total concentration of about 0.1 M, and comprised 90% by weight of FPT monomer and 10% by weight of BT dimer.

Following electrode fabrication, a single cell ultracapacitor 10 was assembled and sealed according to the procedure illustrated in copending patent application S-91,747, Method for Fabricating a Conducting Polymer Ultracapacitor, filed concurrently herewith and incorporated herein by reference. The complete device had a thickness of 0.1 cm and an effective cross-sectional area of 2 cm$^2$, with packaged weight of 0.25 g.

Electrode fabrication and cell assembly were all carried out in an argon-filled dry glove box. Electropolymerization and impedance measurements were performed using an EG&G PAR Model 273A potentiostat in conjunction with a Solartron 1260 impedance analyzer. Capacitor charge/discharge cycling was carried out using a MACCOR battery test system equipped with three high speed channels having a data acquisition rate of 1.3 ms per point. Custom software was used to control the experiments and record the data.

Acetonitrile (Aldrich, Sure-seal, 99.8%, anhydrous, <50 ppm water) was used as a solvent throughout. Tetraalkylammonium salts were purified by repeated recrystallization. Tetraethylammonium tetrafluoroborate ($Et_4NBF_4$, Fluka, purum, >99%) was recrystallized four times from methanol and dried under vacuum at 200° C. for 24 hours. Tetraethylammonium hexafluorophosphate ($Et_4NPF_6$, Fluka, purum, >98%) was recrystallized four times from methanol/water (about 5% by volume of water) and dried under vacuum at 150 ° C. for 24 hours before use. The 3-(4-fluorophenyl) thiophene (FPT) monomer and 3,3'-bithiophene (BT) dimer starting materials were synthesized and purified (>99%) according to procedures well-known in the art.

The finished single cell capacitors were characterized by a series of tests, including deep discharge (longer duration) and pulsed discharge tests, cycle-life, self-discharge and leakage current tests. Impedance tests were also performed to monitor changes in cell resistance. The single cell ultracapacitor could be fully charged at a cell voltage as high as 3.2 V. In the following described experiments, the devices were tested at 2.8 V.

Deep Discharge Performance of Single cell Device with Improved Active Material

Figure 6:
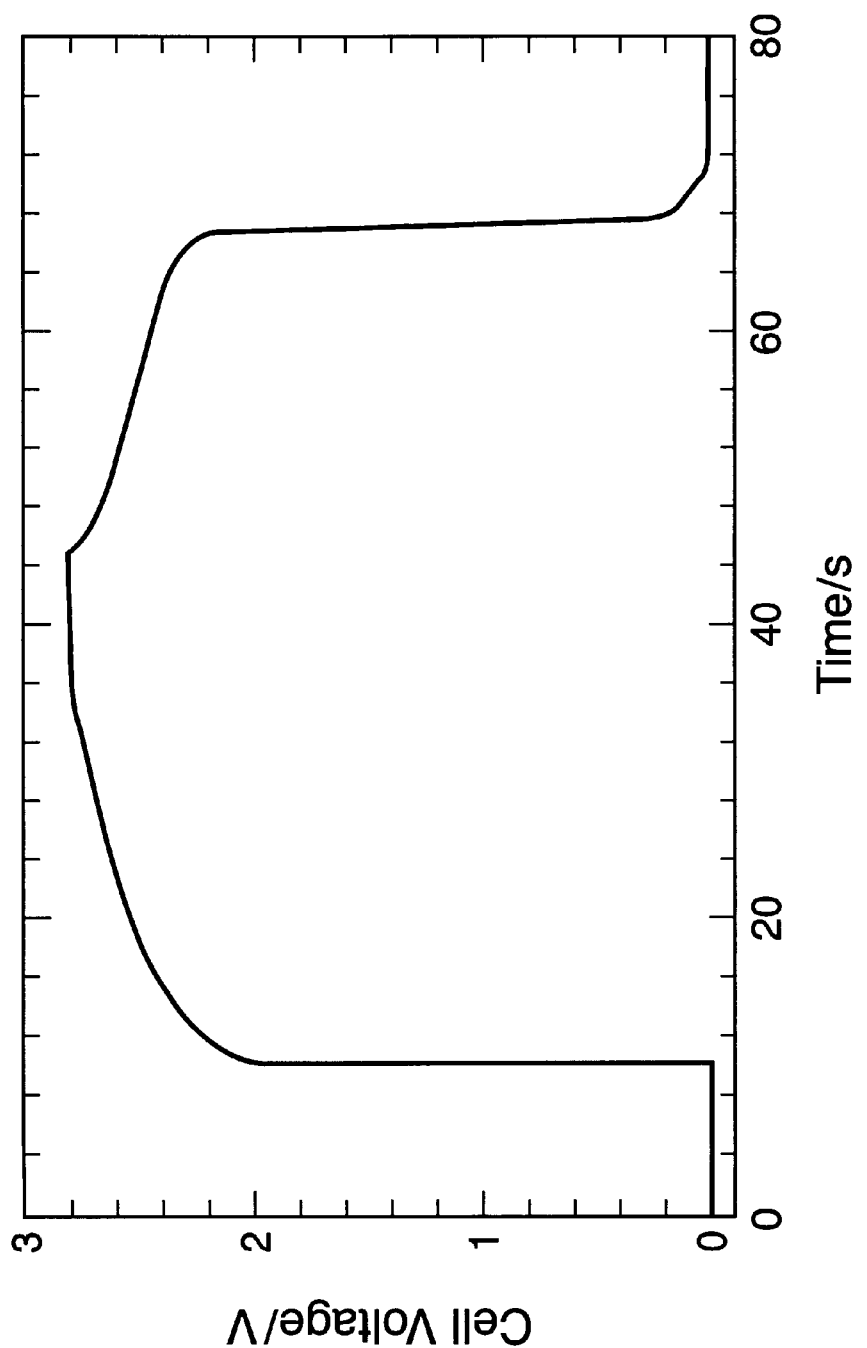
FIG. 6 graphically depicts a deep charge-discharge cycling voltage-time curve for a single-cell ultracapacitor according to the present invention.

Referring now to FIG. 6, a deep charge-discharge cycling curve is shown for the single-cell ultracapacitor described above. The device was charged and discharged in this case between 0 and 2.8 V, at 10 mA/cm$^2$, holding for 10 s at the charge and discharge voltage endpoints (2.8 and 0.1 V). It should be noted that most of the stored charge is released at high voltages, between 2.8 V and 2.3 V, resembling battery discharge. This is advantageous, because charge delivered at voltages that are too low may not be useful. (In contrast, for a carbon type capacitor the charge is delivered linearly between the high and low voltage limits).

Figure 7:
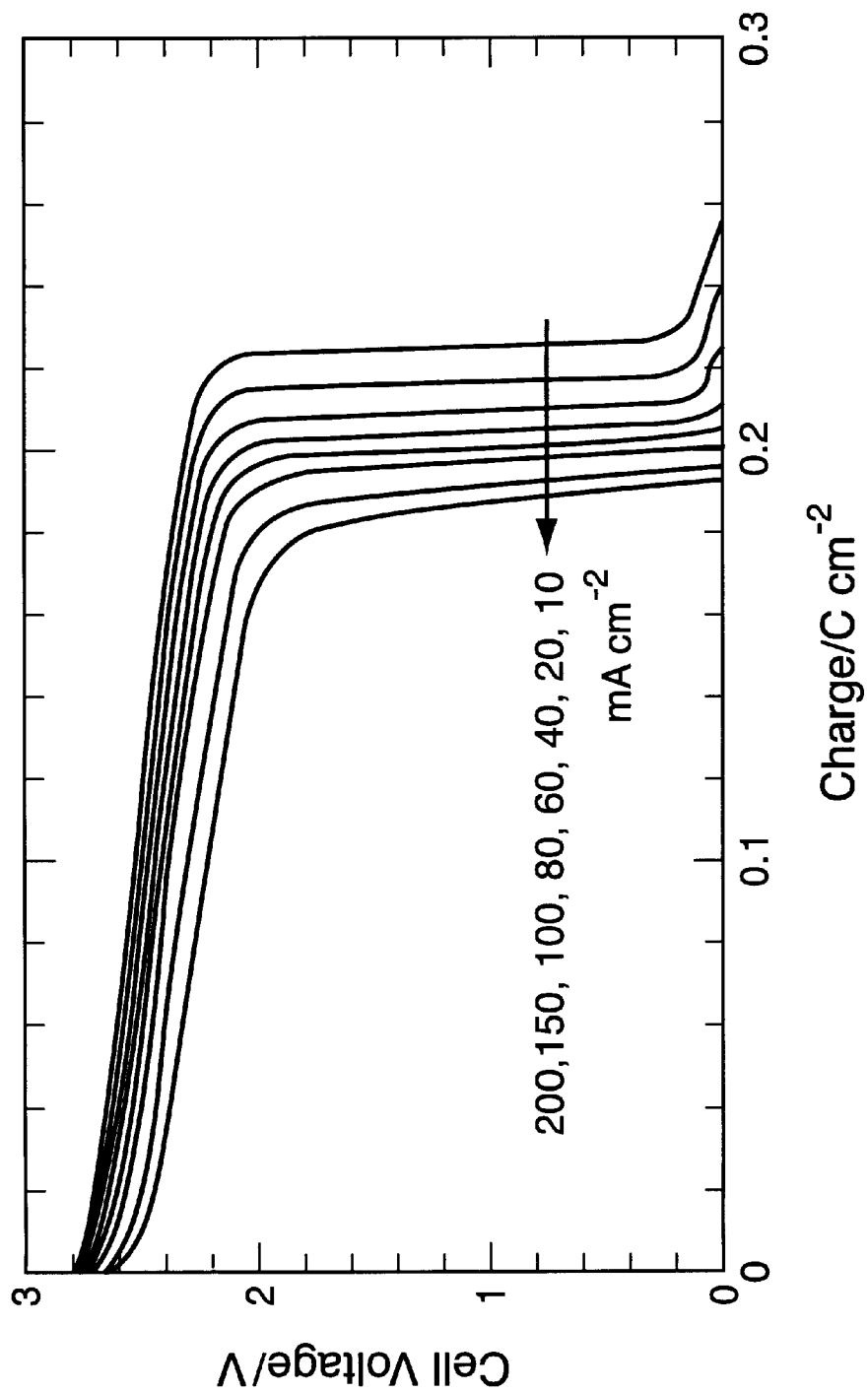
FIG. 7 graphically depicts deep discharge curves measured at various current densities.

FIG. 7 shows deep discharge curves between 2.8 V and 0 V, measured at current densities from 10 to 200 mA/cm$^2$ for this single-cell ultracapacitor. The initial cell voltage drop, corresponding to ohmic drop on the cell ESR, increases proportionately with increasing discharge current. The charge capacity at 200 mA/cm$^2$ is still about 85% of that at 10 mA/cm$^2$, a direct indication of the beneficial, fast discharge characteristic.

Figure 8:
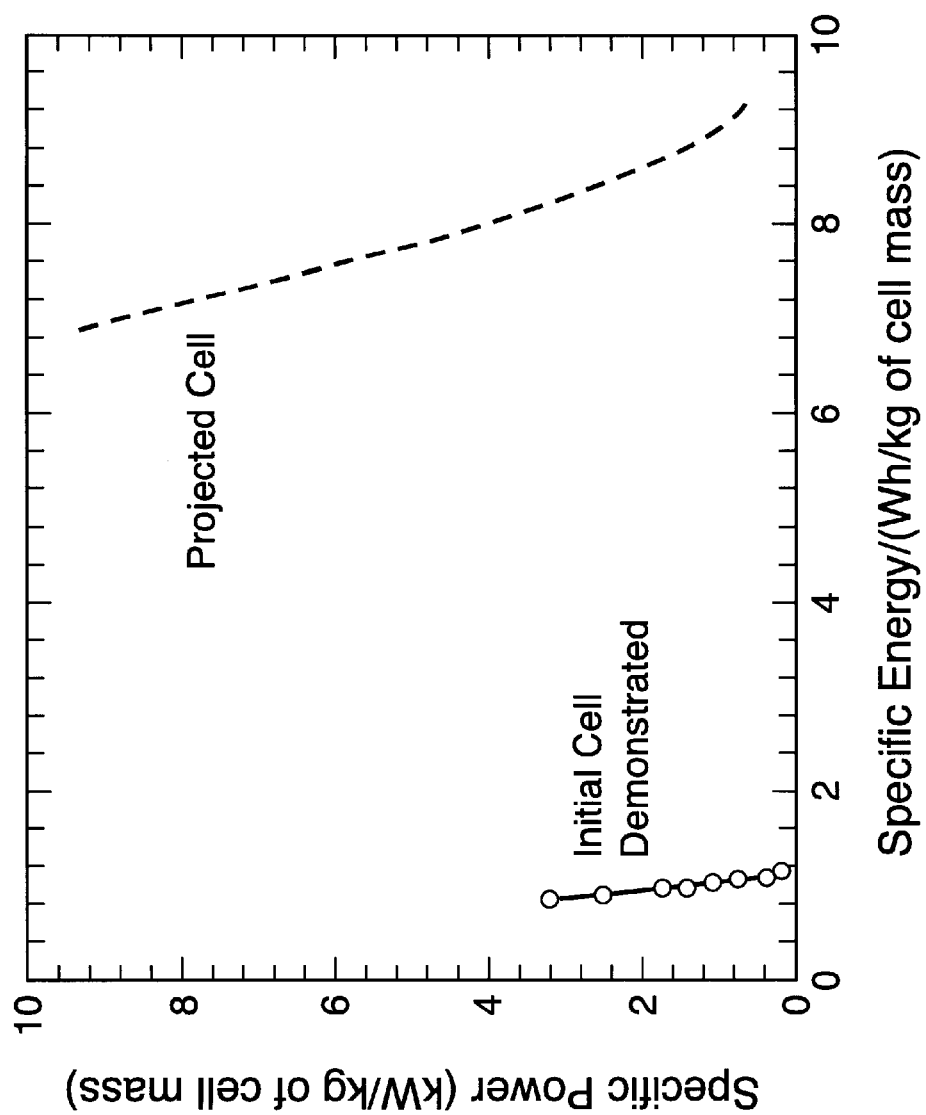
FIG. 8 graphically depicts Ragone plots demonstrated for an actual experimental cell and projected for increased polymer loading density.

FIG. 8 shows the corresponding Ragone plots, relating the output energy density to output power density, all expressed in terms of the mass of the complete single-cell device. The energy density only slightly decreases with increase of power density. Assuming that the charge/discharge dynamics could be maintained at a higher polymer loading facilitated by the newly improved polymer morphology (shown in FIG. 2), an energy density of 7 Wh/kg at a power density of 9.5 kW/kg of cell mass is projected.

Table I summarizes the major characteristics of deep discharge performance based on overall cell mass and volume.

TABLE I

Deep discharge characteristics of a single-cell Type III ultracapacitor.

| | Demonstrated Initial Cell | Projected Cell |
|---|---|---|
| Voltage | Max. 3.2 V; Working 2.8 V | Working 3.0 V |
| Capacitance | 3.6 kF/kg, 5.2 kF/l | 35 kF/kg, 43 kF/l |
| Energy Density | 0.9 Wh/kg, 1.3 Wh/l | 7.0 Wh/kg, 8.6 Wh/l |
| Power Density | 3.2 kW/kg, 4.6 kW/l | 9.5 kW/kg, 12 kW/l |

Pulsed Discharge Performance and Cycle Life Testing of Single Cell Device

Figure 9:
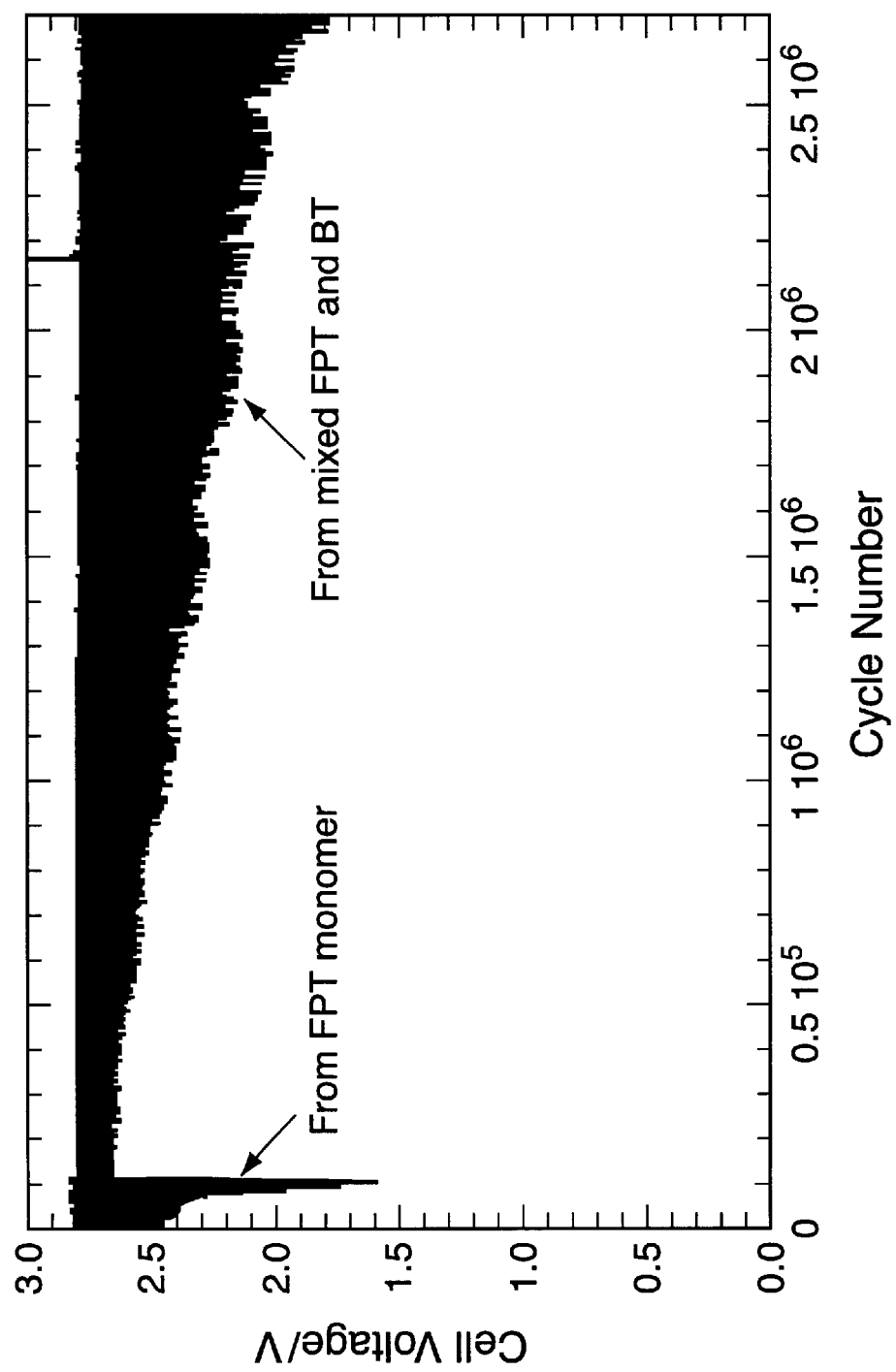
FIG. 9 graphically depicts measured cell voltage variation during pulse discharge over a large number of charge-discharge cycles for an ultracapacitor formed from FPT monomer alone and one formed from a FPT and BT mixture.

Considering the load profile in some practical applications, pulsed discharge tests were performed by drawing a 100 mA/cm$^2$, 5 ms discharge pulse, followed by a "standby" step of 10 mA/cm$^2$, charging to 2.8 V and clamping the voltage at 2.8 V for 100 ms (this scheme corresponds to about 5% duty cycle). In spite of demonstrated high energy and power densities for the Type III capacitor, a significant shortcoming in the past was limited cycle life—a major challenge with conducting polymer, as well as other active materials operating across a wide voltage window. In experiments with an ultracapacitor with PFPT active material, life tests in pulsed discharge mode had to be limited to $10^5$ cycles, as shown in FIG. 9. In contrast, with the discovered new conducting active material, the cycle life has been extended up to $2.7 \times 10^6$ cycles without significant loss in power performance.

Figure 10:
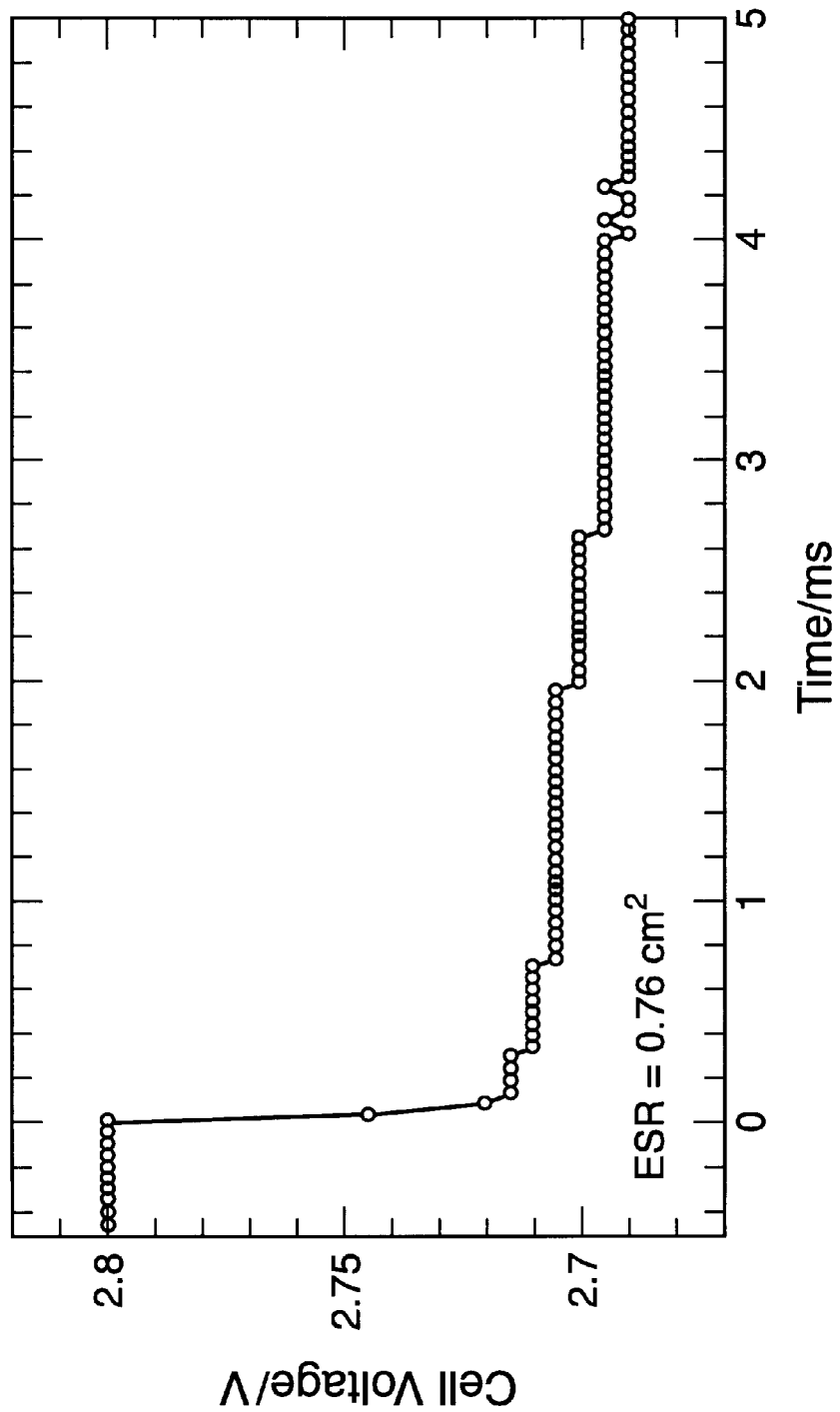
FIG. 10 graphically depicts the voltage drop measured during a 5 ms discharge pulse.
Figure 11:
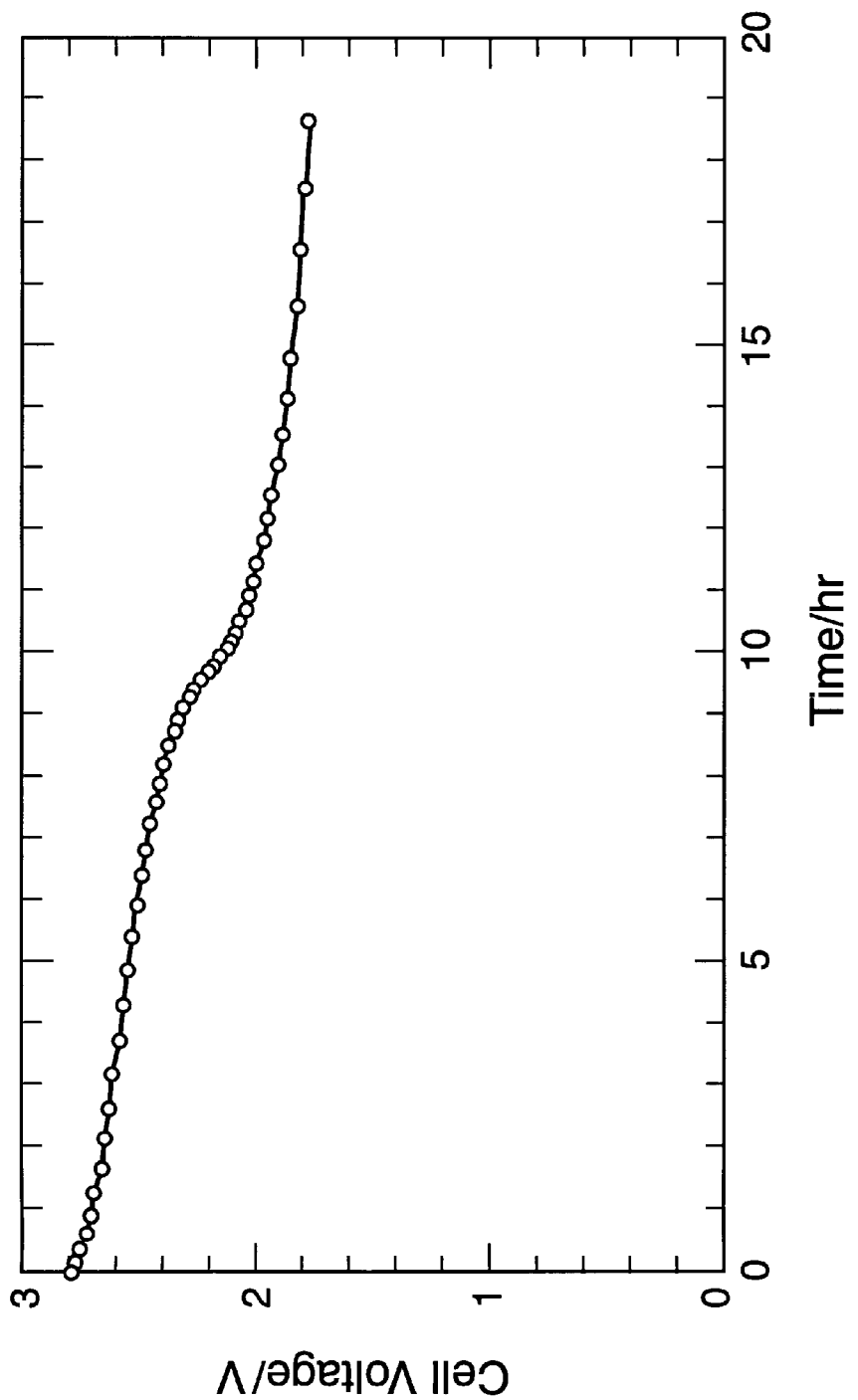
FIG. 11 graphically depicts the self-discharge behavior of a single cell ultracapacitor.

FIG. 9 shows measured cell voltage variations during $2.7 \times 10^6$ charge-discharge cycles under the pulsed power conditions described above. The variation in cell voltage drop on discharge over such extended cycling, is satisfactory for practical application. At the beginning of cycling, the total voltage drop measured during the 5 ms discharge pulse is 0.11 V, as shown in FIG. 10, which is only 4% of overall cell voltage. As seen in FIG. 9, a gradual increase in voltage drop on discharge was measured, but the device remained useful as source of pulsed power following $2.7 \times 10^6$ pulsed discharge cycling.

As summarized in Table II, the capacitance within the 5 ms discharge pulse is 102 F/kg of total cell weight. The energy density is 10 J/kg and the power density 2 kW/kg of total cell weight. These values are projected to be tripled after further optimization by increasing conducting polymer active material loading and reducing weight of inactive components.

TABLE II

Pulsed power performance of a single-cell Type III ultracapacitor under 5 ms discharge pulsing at 100 mA cm$^{-2}$.
Parameters correspond to overall cell mass and volume.

|  | Demonstrated Initial Cell | Projected Cell |
| --- | --- | --- |
| Working Voltage | 2.8 V | 3.0 V |
| ESR | 0.76 Ωcm$^2$ | 0.5 Ωcm$^2$ |
| Voltage Drop | 0.11 V | 0.08 V |
| Capacitance | 102 F/kg, 146 F/l | 306 F/kg, 259 F/l |
| Energy Density | 10 J/kg, 14 J/l | 32 J/kg, 27 J/l |
| Power Density | 2.0 kW/kg, 2.9 kW/l | 6.5 kW/kg, 5.5 kW/l |

Single Cell Ultracapacitor Device: Self-Discharge and Leakage Current Tests

Self-discharge tests were performed by charging the capacitor to 2.8 V and then monitoring voltage change under open-circuit conditions. Cell voltage dropped from 2.8 V to 2.4 V in 9 hours, as shown in FIG. 12. The leakage current for the single cell prototype was found in the range of 10 $\mu$A/cm$^2$. This self-discharge behavior is comparable to the reported behavior of commercial ultracapacitors, although cell packaging in the test case was obviously not based on optimized fabrication.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An electrode having a conducting polymer active material for use in an ultracapacitor comprising:

a carbon paper substrate; and a conducting polymer deposited on the carbon paper substrate and formed by electropolymerization from a mixed solution of a dimer of (3,3' bithiiophene) (BT) and a monomer that is selected from the group of thiophenes derived in the 3-position, having an aryl group attached to thiophene in the 3-position or having aryl and aklyl groups independently attached to thiophene in the 3 and 4 positions.

2. The electrode of claim 1, wherein the monomer is 3-(4-fluorophenyl) thiophene (FPT).

3. The electrode of claim 1, wherein the weight ratio of monomer to BT is about 9:1.

4. The electrode of claim 2, wherein the weight ratio of monomer to BT is about 9:1.

5. The electrode of claim 4, wherein the total concentration of FPT monomer and BT dimer is about 0.1 M.

6. The electrode of claim 5, wherein the mixed solution further includes a supporting electrolyte dissolved in acetonitrile, where the supporting electrolyte is selected from the group consisting of tetraethylammonium salts of trifluoromethanesulfonate, tetrafluoroborate, and hexafluorophosphate.

* * * * *